United States Patent [19]

Jeppesen, III et al.

[11] Patent Number: 5,530,727
[45] Date of Patent: Jun. 25, 1996

[54] HALF SYNCHRONIZER CIRCUIT INTERFACE SYSTEM

[75] Inventors: James H. Jeppesen, III, Lake Forest; Bruce E. Whittaker, Mission Viejo, both of Calif.

[73] Assignee: Unisys Corporation, Blue Bell, Pa.

[21] Appl. No.: 204,017

[22] Filed: Feb. 28, 1994

[51] Int. Cl.[6] ............................................. H04L 7/02
[52] U.S. Cl. ............................ 375/359; 327/161; 327/263
[58] Field of Search .................................. 375/354, 355, 375/359, 360, 364, 370, 377; 370/108; 327/263, 141, 162, 161; 326/93

[56] References Cited

U.S. PATENT DOCUMENTS

| | | |
|---|---|---|
| 4,821,295 | 4/1989 | Sanner ..................................... 375/360 |
| 4,935,942 | 6/1990 | Hwang et al. ........................... 375/354 |
| 5,172,397 | 12/1992 | Llewellyn ................................ 327/141 |

*Primary Examiner*—Stephen Chin
*Assistant Examiner*—Kevin Kim
*Attorney, Agent, or Firm*—Alfred W. Kozak; Mark T. Starr; Robert R. Axenfeld

[57] ABSTRACT

Control signals are provided for data transfer timing compatibility between two systems or two modules which are not synchronous with each other. Specialized circuitry is provided to ensure timing compatibility in that control signals, transmitted from one system to the other, are handled by interface circuitry which directly transmits the front-end transition and delays the back-end transition so it can be synchronized to the receiving systems clock.

7 Claims, 6 Drawing Sheets

HALF SYNCHRONIZER CIRCUIT INTERFACE SYSTEM

FIELD OF THE INVENTION

This disclosure pertains to the field of circuitry interfaces wherein digital modules asynchronous to each other may be made compatible in digital transfer operations.

BACKGROUND OF THE INVENTION

In the field of digital electronics, it is quite often that a new design module is added into a pre-existing system which system may be made up of other pre-existing modules. On the other hand, it may occur that some older, pre-existing module must be made to operate in cooperation with a system made up of other new modules. Since there is no clock common to both of the digital systems, they are asynchronous to each other and the problem arises in compatibly transferring digital data between these two systems.

In either of these cases, the new overall system designed must operate compatibly with pre-existing environments and must interface with pre-existing devices that use pre-existing protocols. This type of coexistence of the new circuitry design with the older circuitry design often presents problems in interfacing digital data transfers between such asynchronously clocked modules.

When two different (asynchronous to each other) circuitry systems are joined together for compatible operation, it was generally required that there be a "full synchronization" of signals, that is to say that both ends ("front" inactive-to-active transition and "back" active-to-inactive transition) of the useful signals be synchronized. However, this would introduce a delay of up to a full clock time on each end of the signal, as indicated in FIG. 5 to allow synchronization of digital signals to occur. In some cases, this type of delay of a full clock time at each end of the synchronization signal could be useful and acceptable. However, many times this is not acceptable since it can introduce significant performance degradation.

One situation that needs attention is that of "set-up time". In the herein described circuitry, there is required a time period where an input signal from a first module or system must have its inactive-to-active transition arrive before the transition (rise) of the synchronous clock of a second module or system. This "setup" time is specifically used for a "D" flip-flop such that the input signal to the flip-flop will occur a few moments (set-up time) before the synchronous clock will trigger the flip-flop and charge its "Q" output.

The circuitry of the present disclosure designated as a half-synchronizer circuitry system alleviates the problem of significant performance degradation. The presently described circuitry synchronizes only the back end of the signal while allowing the other front end to propagate through as it is generated from its source module.

The circuitry interface described herein can be used to solve a common but critical problem. Although simple in basic design, the problem solved by "half-synchronizing" a signal is an important and immediate solution.

As previously discussed, since most new designs must operate with other type of modules, they, however, often do not interface well together, that is to say, their timing activity of significant event transitions, being asynchronous to each other, do not necessarily meet each other's optimum timing conditions. Thus the synchronizing of such non-optimum signals is required for a system design program to insure compatibility of data transfer and control signal operations between the different modules or systems.

When required to deter performance degradation and under appropriate conditions, the "half-synchronization" system can provide a safe, reliable and deterministic design without effecting system performance in a negative sense, i.e., by delaying transmission of digital data signals.

The presently described half-synchronizer circuit interface system permits separate (asynchronous) systems to communicate compatibly together with a minimum loss of performance, that is to say, without the additional need for clock time delays which would normally be required.

SUMMARY OF THE INVENTION

The presently described half-synchronizer circuit interface system permits a communication linkage between two separate operating modules one of which is synchronous (the receiving module) and the other of which is asynchronous (the sending module) to the receiving module. Thus an asynchronous signal can be used by a synchronous circuit module without first synchronizing the signal it is receiving and without degrading the performance of data signals sent from the asynchronous module to the receiving synchronous module.

Previously, the communication linkage between asynchronous modules required a separate register to hold the incoming data signal for a period (such as a full-clock time delay) before it could be received by the hardware of the receiving synchronous circuit module.

The presently described half-synchronizer interface system eliminates the use of a holding register (and the time delay involved) by synchronizing the incoming asynchronous control signal to insure that it will not change (from high-inactive to low-active or from low-active to high-inactive) until there is a rising clock edge in the clock signal of the receiving synchronous circuit module.

The input asynchronous control signal is transmitted directly to an AND gate and concurrently through a flip-flop (clocked by the clock of the receiving synchronous module) which also feeds the same AND gate. Since the flip-flop is synchronized with the receiving synchronous module, then the incoming asynchronous control signal "active" transition front-end will only be released to the synchronous circuitry at the first appearing clock edge time applied to the flip-flop after appearance of the incoming asynchronous control signal. Additionally, the "inactive" transition (back-end) of the incoming control signal is extended to a rising clock edge to insure that sufficient set-up time has occurred to enable all receiving circuits to receive the signal simultaneously.

DESCRIPTION OF PREFERRED EMBODIMENT

Figure 1A:
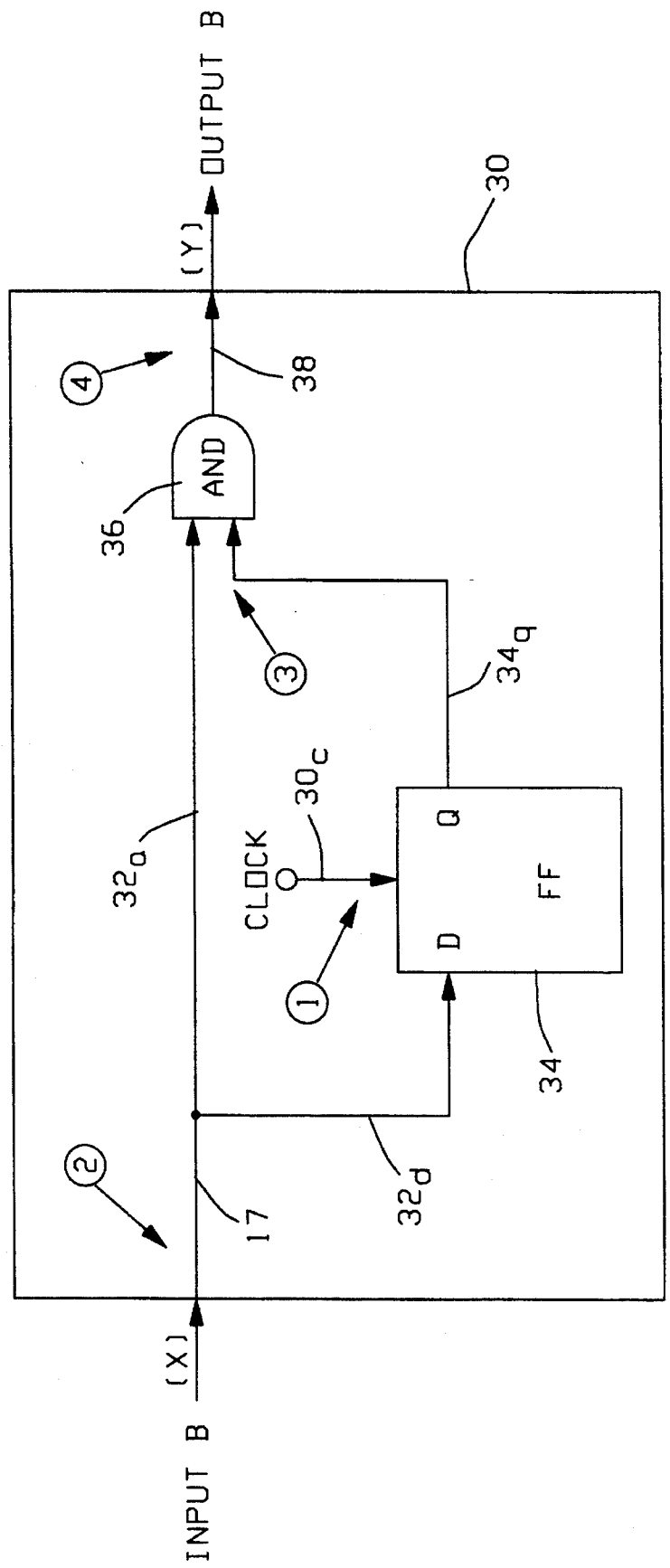
FIG. 1A is a circuit diagram of the half-synchronizer interface circuitry.
Figure 1B:
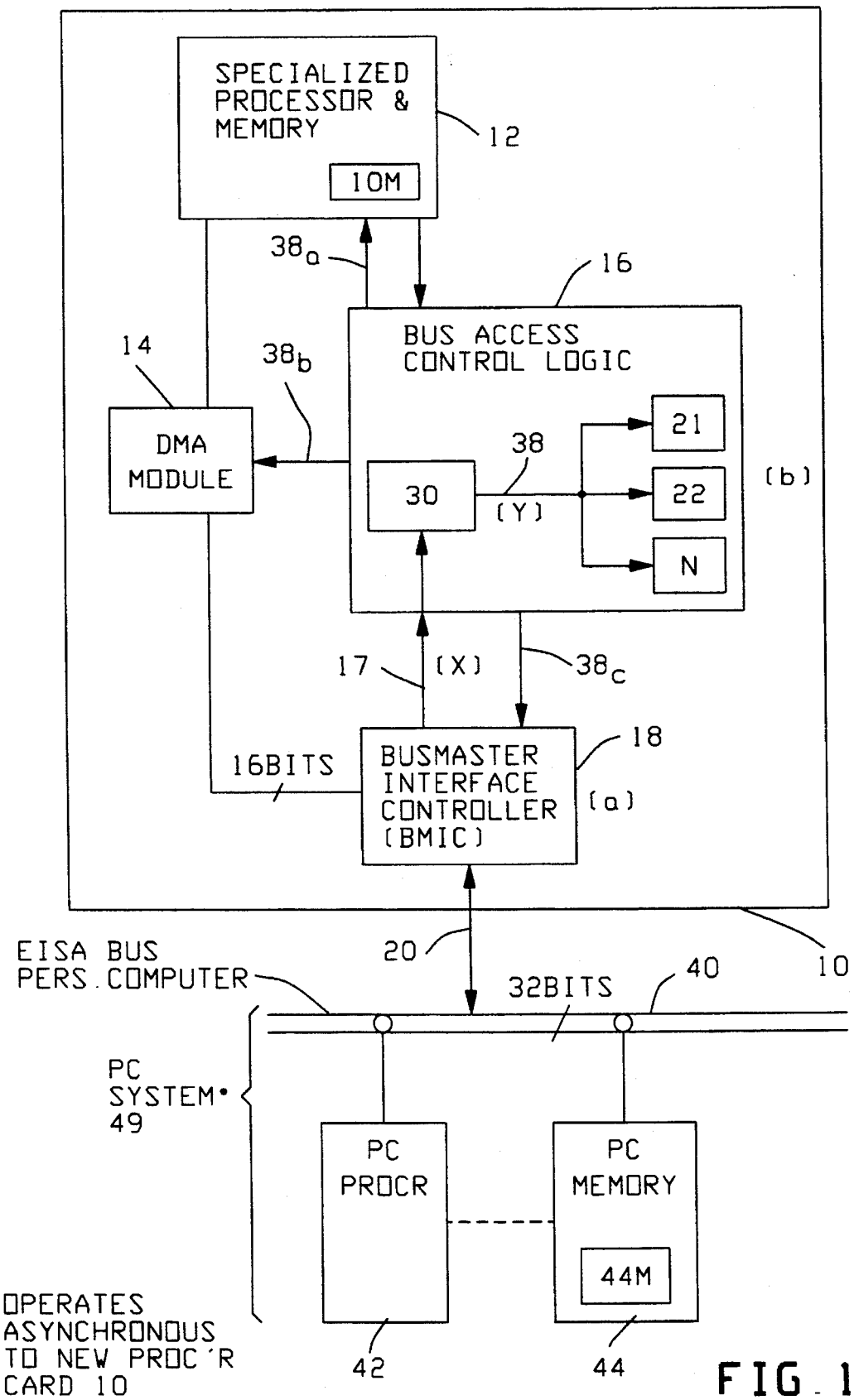
FIG. 1B is a drawing of a newly connected system wherein a new design module is added into a pre-existing system.

The environment involved in the present disclosure may be illustrated by such modules as shown in FIG. 1B where a pre-existing personal computer system 49 is seen to have a EISA bus 40 to which is attached the processor 42 and memory 44 plus other modules shown by the dashed lines.

It may be desired to connect to this personal computer 49, another circuit module shown in FIG. 1B by the new processor card 10. The processor card 10 may, for example, have a specialized processor with memory 12, a direct memory access (DMA) module 14, a bus access control logic unit 16 and a bus master interface controller 18 (BMIC) which may be a standard device manufactured by the Intel Corporation of Santa Clara, Calif. The BMIC 18 will be timed by the pre-existing personal computer system 49 and not be timing compatible to circuitry in card 10. A bus 20 connects the bus master interface controller (BMIC) 18 to the personal computer's EISA bus 40 which may, for example, be a 32 bit bus, that is to say, a 32-bit parallel bus.

The processor card 10 is essentially inserted by slotted inter-connections into the standard EISA personal computer (PC) system 49. The PC modules (42, 44) and the bus 40 operate at a clock timing asynchronous to the clock timing at which the new module 10 is operating. Additionally, the bus protocol on the bus 40 may have no similarity to the bus protocolsstructures required on the processor card 10.

The bus master interface controller (BMIC) 18 is an Intel Corporation device which is designed to properly interface with the EISA personal computer bus 40. The bus master interface controller is a controller manufactured by the Intel Corporation of Santa Clara, Calif. and designated as Intel Part No. 82355. However, since the bus master interface controller (BMIC) 18 is a standard industry device, its output signals on bus 17 may not necessarily match with the optimum operation of the circuitry in the newly inserted module card 10.

The bus master interface controller (BMIC) 18 in FIG. 1B, must make the proper and appropriate adjustments between the standard older pre-existing environment of the PC system 49 and the non-standard specific new environment provided by the processor card 10.

Figure 3:
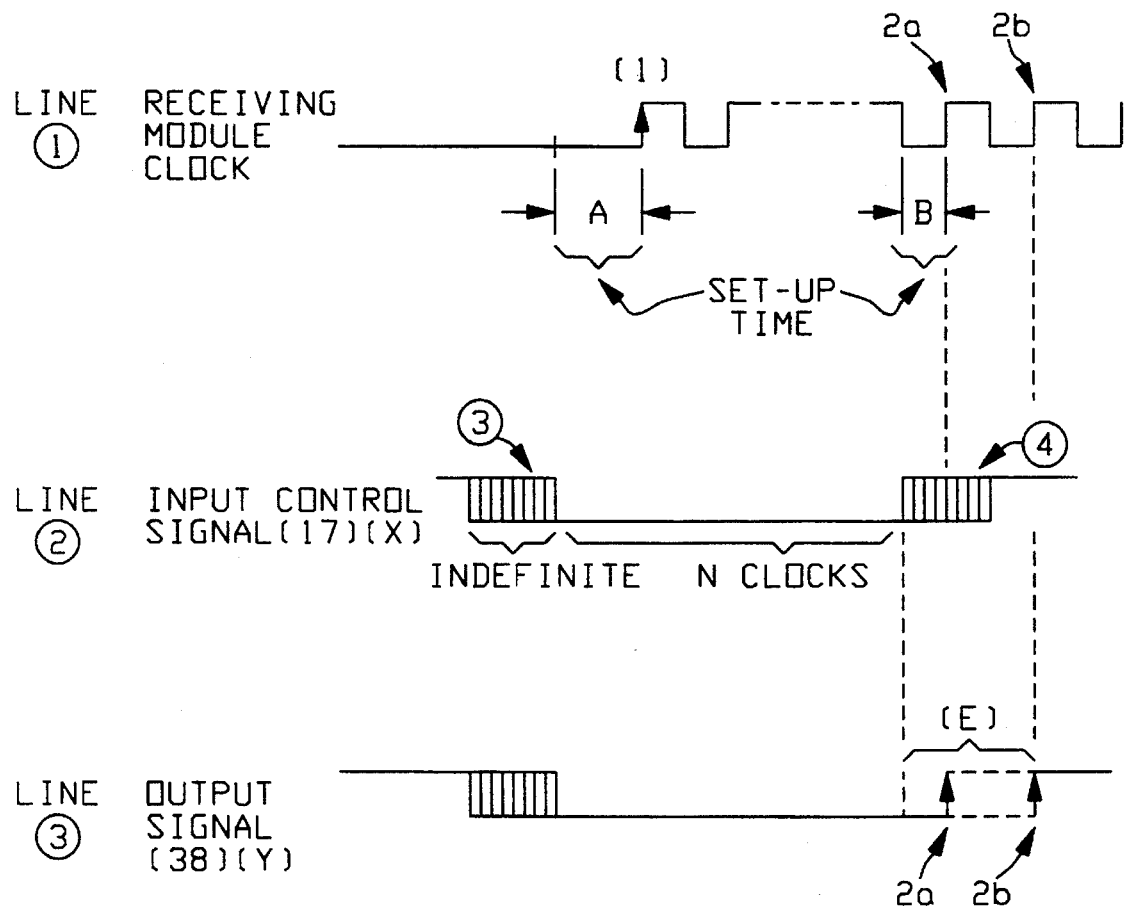
FIG. 3 is a timing diagram indicating how the half-synchronizer circuitry interface system provides an extension time period in order to make input and output signals synchronously compatible.
Figure 4:
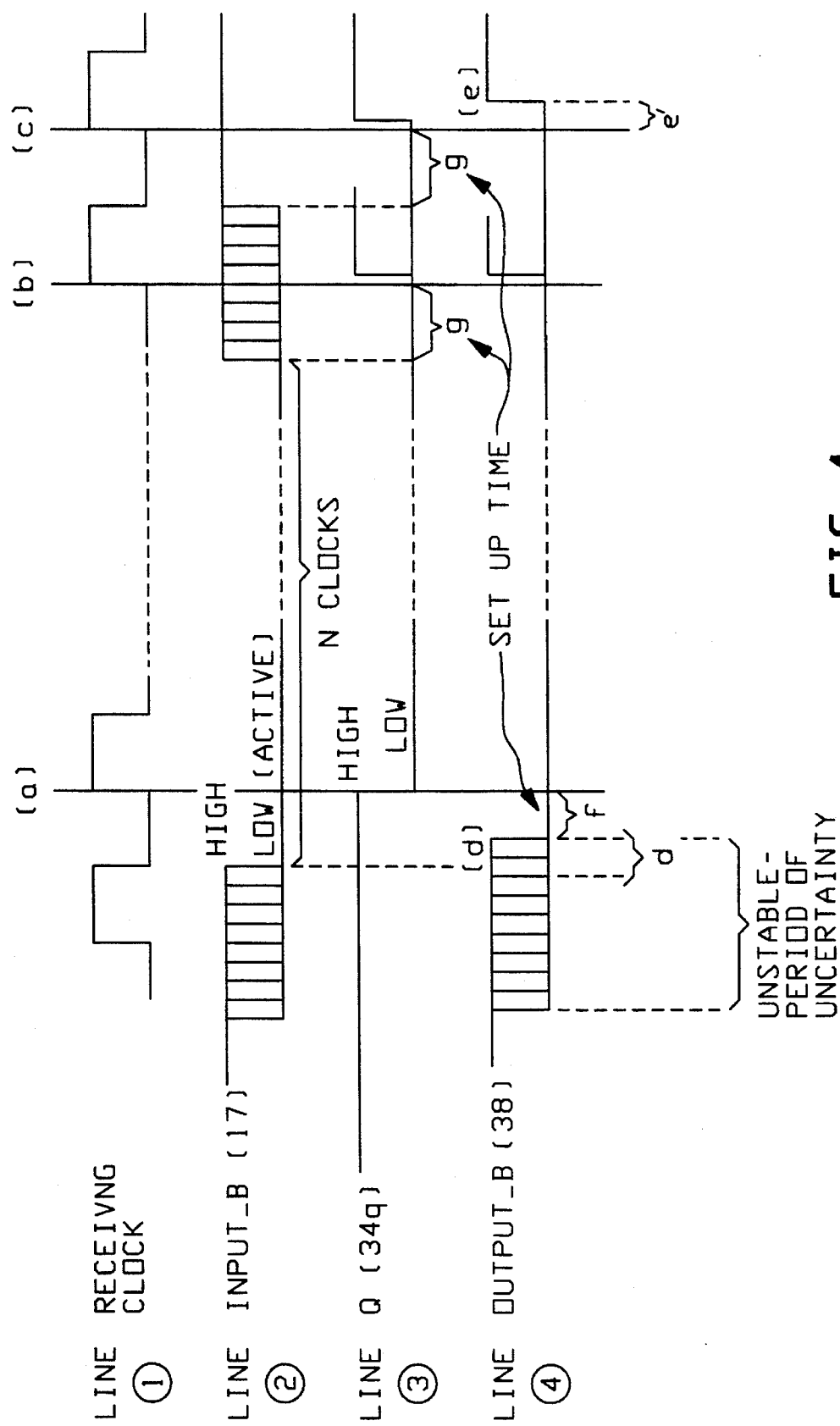
FIG. 4 is a timing diagram indicating how the output of the half-synchronizer circuit interface will form a compatible control signal between a first pre-existing module to the circuitry in a newly added second module.

The BMIC 18 which is a standard unit manufactured by the Intel Corporation has an "uncertainty period" between its input and output signals. These are shown in FIGS. 3 and 4 as a set of multiple vertical lines which indicate an indefinite period for signal transition to occur the Intel Corporation specification provides a period of indefiniteness indicating the maximum time and minimum time that occurs between an input transition and its corresponding output follow-on transition. This period of uncertainty must be accounted for to develop a certainty of timing for the input-output signals. FIGS. 3 and 4 have indications showing the periods of transition uncertainty which must be taken into consideration.

The present half-synchronizer circuitry interface system will be seen to present a logical circuit which aids in the interfacing of non-optimal yet compatible protocols. The described system presented herein provides this interface timing adjustment while maintaining the best possible performance characteristic without any significant degradation due to delay periods.

Figure 2:
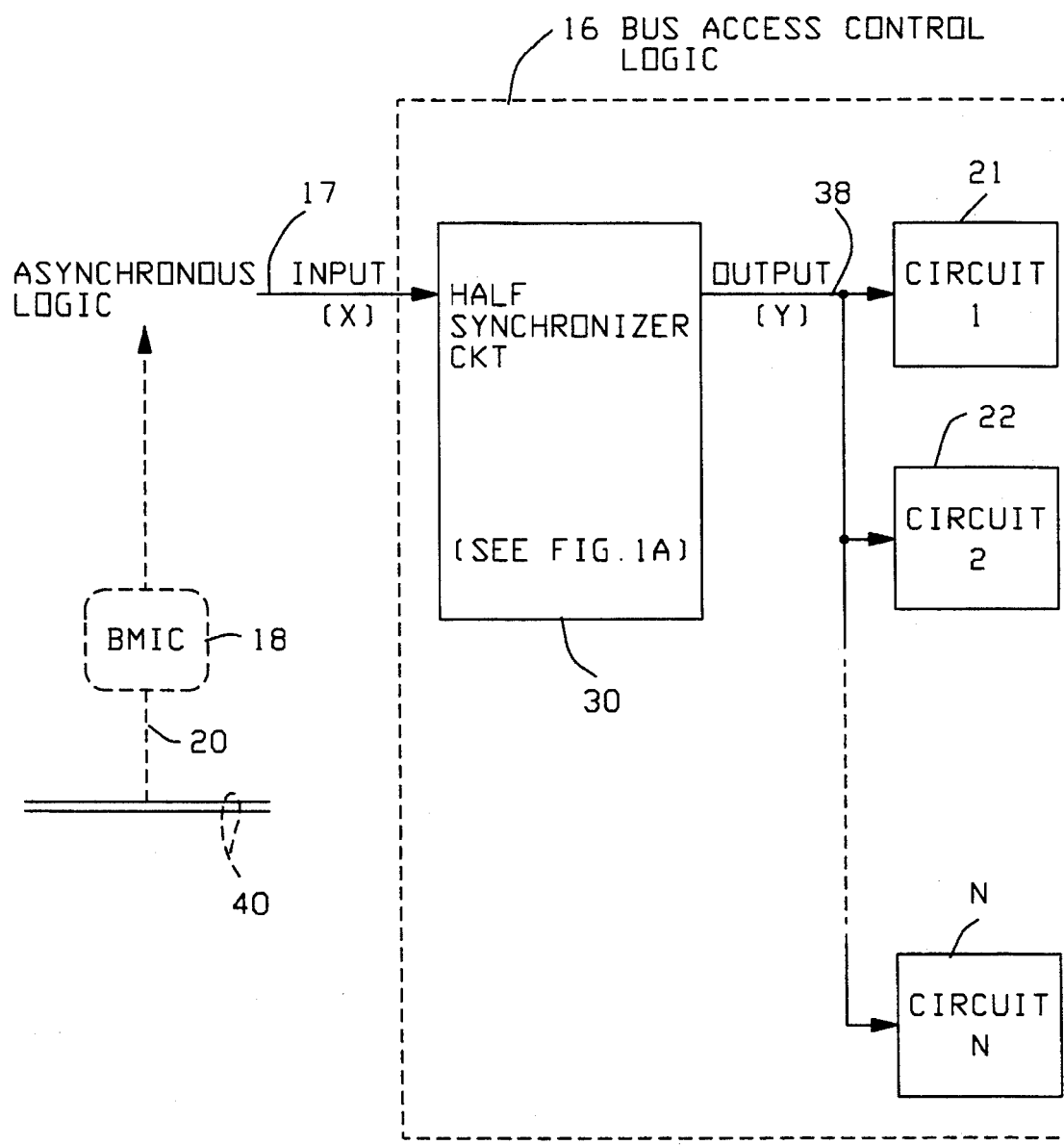
FIG. 2 is a diagram showing the insertion of the half-synchronizer interface circuit between a plurality of receiving circuits in a newly attached processor card and the asynchronous logic input from an existing personal computer bus and interface controller.

FIG. 2 is a simplified block diagram of the Bus Access Control Logic Unit 16 showing the half-synchronizer circuit 30 receiving an input 17 from the asynchronous logic of the bus master interface controller (BMIC) 18. It provides an output 38 which is fed to various circuit modules designated circuit 21, circuit 2, and circuit N, which are state machines used to control the data flow between DMA unit 14 and the BMIC unit 18.

Thus the half-synchronizer circuitry takes the input signal 17 (also designated X) and produces the output signal 38 (also designated as Y) shown in FIGS. 1B and 2 and also as the output signal 38 in FIG. 3. It will be noted that the output signal 38 fans out (FIG. 2) to the various blocks of state machine logic designated 21, 22, . . . N, in FIG. 2.

For proper system operation, it is necessary that each of the receiving circuits 21, 22, . . . N must see the output signal 38(Y) at the same active clock time.

With reference to FIG. 3, there is seen a timing diagram depicting the input signal 17(X) received by the half-synchronizer circuit 30 and which provides the output signal 38(Y) which is a product of the half-synchronizer circuitry. Also seen on the first line (line 1) of FIG. 3 is the clock timing signals for the receiving circuits 21, 22, . . . N (state machines).

The timing specified by the pre-existing module (personal computer system 49) which sources the input signal 17, guarantees that the "front-end" of the input signal (FIG. 3) (line 2 for input signal 17) will always occur before the clock edge (1) of the receiving module clock (seen on line I of FIG. 3). A control signal from Bus Access Control Logic 16 is sent to BMIC 18 causing BMIC 18 to transmit the input signal 17 at a time which will arrange the input front-end transition to precede the clock edge (1) of FIG. 3, Line 1.

However, the pre-existing module (personal computer 49) can not guarantee the timing of the "back-end" of the signal shown at location 4 of line 2 of FIG. 3. This type of condition is common when interfacing to standardized protocols and devices and also where asynchronous clocking is involved.

As seen in FIG. 3 the "front-end setup time" (A) for all the receiving circuits is met by the input signal 17(X), but the "back-end setup time" (B) in FIG. 3, is not necessarily met by the input signal 17(X). Thus, the input signal on busses 20 and 17 (FIG 1B) from the pre-existing module (PC System 49) can not be used directly as the fan-out signal to all the receiving circuits 21, 22, . . . N in the Bus Access Control Logic 16.

If the signal on line 17 (FIG. 1B) from the preexisting module (PC 49) were used directly, an indefinite and unpredictable situation would occur on the rising, "back-end" (location 4) of the input signal 17 at the time of the receiving clock (B) in the first line of the FIG. 3. This is so since the uncertainty time 4 in line 2 of FIG. 3 could possibly activate only some but not all of the receiving units, 21, 22, . . . N. This is not an acceptable condition.

As seen in FIG. 3, the half-synchronizer circuitry system extends the output signal 38 (Y) for a time period (E) to guarantee that both ends (front-end and back-end) of the incoming data signal will meet the "set up times" for all receiving circuits 21, 22, ... N. It will be noted that only the back-end at position 4 (line 2 of FIG. 3) of the input signal 17 is changed while the front-end (at location 3) is left unchanged in FIG. 3 at line 2 of FIG. 3.

The period at (E), line 3 of FIG. 3, indicates that the rising edge of output signal (38)(Y) can occur at either position $2_a$ or $2_b$ without compromising the design. The only requirement is that the signal is synchronized by a rising clock edge before continuing through to the modules 21, 22, ... N of FIGS. 1B and 2.

If the Half-Synchronizer system were not used, and by merely delaying the input signal 17, then the extension period (E), at line 3 of FIG. 3, would be on both ends (front-end and back-end) of the output signal 38. This would cause the front-end location 3 to miss the setup time (A) of the receiving circuits 21, 22, ... N.

Figure 5:
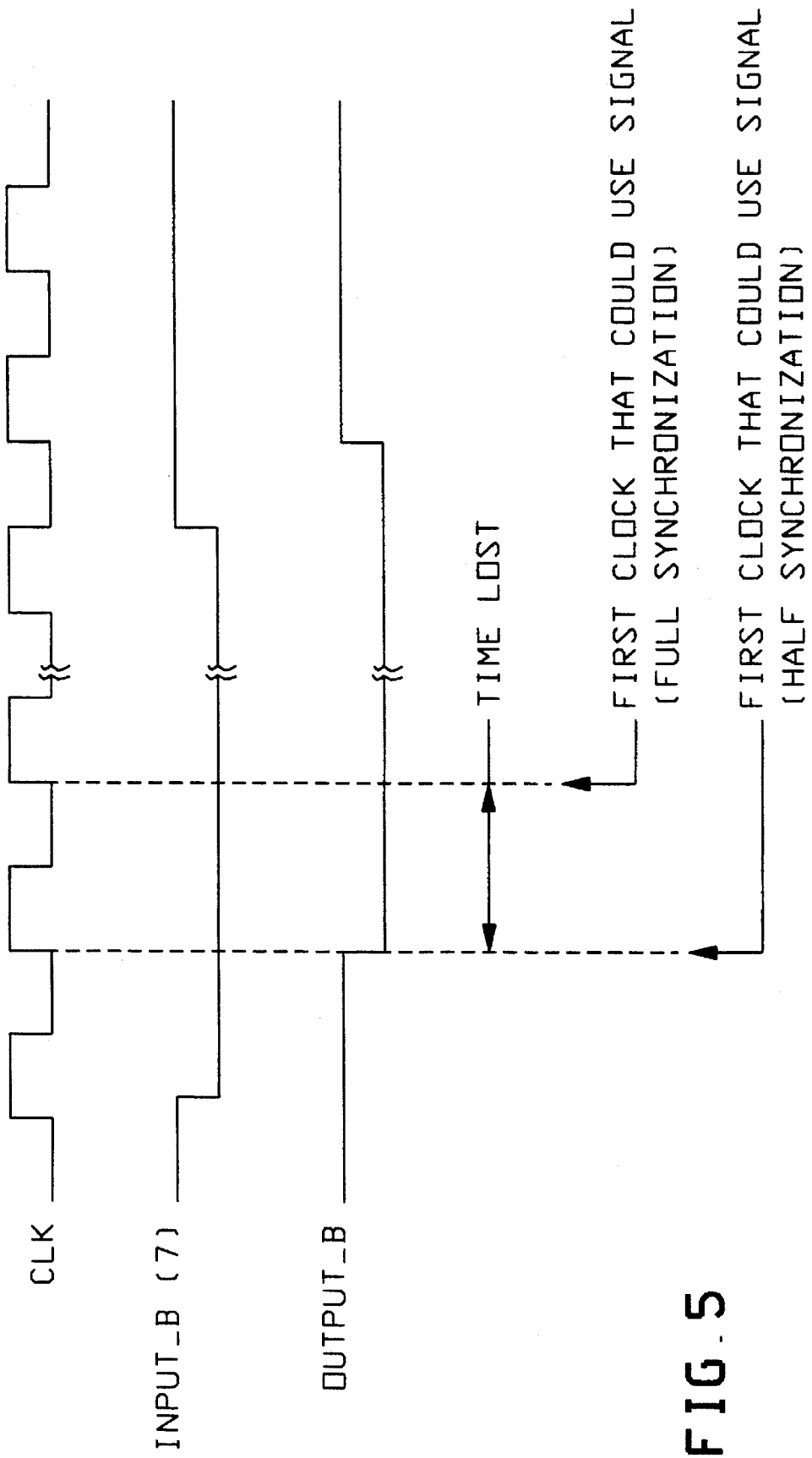
FIG. 5 is a timing diagram of the receiving module's clock and illustrating how one-clock period would be lost and wasted if full synchronization were used instead of the half-synchronization method.

If this occurs, then the system performance would be adversely affected (as indicated in FIG. 5) since the output signal 38 would occur a full clock time later then it would if it were using the Half-Synchronizer circuitry system.

It might be indicated that the Half-Synchronizer circuitry system provides an output signal that is "front-end quick" and "back-end delayed". Thus it is only required that the back-end be synchronized while the front-end be used directly on the clock's rising transition.

Referring to FIG. 1A, there is seen a simplified diagram of the Half-Synchronizer circuitry system 30. The line 17 has a signal INPUT-B which is directly fed on line $32_a$ to AND gate 36. Another branch on line $32_d$ is fed to the D input of the flip-flop 34. The Q output of flip-flop 34 is fed on line 344 into the AND gate 36. The output of the AND gate 36 provides a line 38 to form the output signal OUTPUT-B.

In the timing diagram FIG. 4, the input signal 17 is passed rapidly to form the output signal 38 (Line 4). The only delay incurred is that of the one gate delay (AND 6) which is a minimal and acceptable time of perhaps only a few nanoseconds (gaps "d" and "e'" in FIG. 4). This portion (front-end) of the output signal is therefore not synchronized to the receiving circuit clock in logic circuits 21, 22, ... N. The input signal 17 also passes through a clocked flip-flop element 34. The output of the flip-flop on line $34_q$ is also used to time the release of input 17 to form the back-end output signal 38 at locations (c)–(e). This portion of the signal (the back-end of the signal) is, however, synchronized to the receiving circuits clock times. Therefore the input B signal is said to have been "half-synchronized" by the circuitry system 30 of FIG. 1A, since only the back-end signal transition was synchronized.

FIG. 4 shows a timing diagram of the clock signals involved. The first line of FIG. 4 shows a signal called the "Receiving Clock" ($30_c$, FIG. 1A). The rising edge of the clock is the active edge designated (a). For clarification purposes, there are shown three important edges for explanatory indication. The first edge designated (a) is the clock edge occurring immediately after the input signal 17 has gone active (low), as in line 2, FIG. 4.

It should be remembered that the source (BMIC 18) for this signal guarantees that this front end of the input signal will meet the set-up times for the receivers 21, 22, ...N, that is to say, that the input will be stable (low) sufficiently before the point (a) such that all receiving elements 21, 22, etc. will act on it at the clock edge time (a).

In actuality, the output signal 38 has a small additional delay (d) shown in line 4 of FIG. 4B and which is caused by the gate 36 in the circuit block 30. However, even so, the output signal 38 will be seen to meet the receivers set-up time, i.e., the output signal on line 38 will "stabilize" (low) before the receiver clock rises at time (a).

Referring again to FIG. 4, the next receiver clock edge of importance is seen at the time (b). This is the edge occurring about the time that the input signal 17 is going inactive (high). This particular end point of the input signal is critical. However, the sourcing device BMIC 18 (Bus Master Interface Controller) for the input signal 17 can not with certainty define this back-end transition with reference to the receiving clock on line 1 of FIG. 4.

If the half-synchronizer circuitry system were not used and the input signal 17 was simply fanned-out to the receiving circuits 21, 22, ... N, then a serious unstable and indefinite condition would exist.

Since the back-end (of input B line 17) at the clock edge time position (b) is indefinite and therefore possibly changing during the rising clock edge at (b) (line 1), then the receiver set-up times can not be assured as having been met. Some receivers may act on clock edge (b) and some may not. There is a potential uncertainty condition and this may have serious system effects.

Thus it should be noted at the clock edge (b) FIG. 4, there is only one element (which is the flip-flop 34 and its output line 344) which may act on the input B signal on line 17. If the flip-flop's set-up time is met, at (c), the output B signal will change state at this point (with a minimal delay time e' for flip-flop and gate operation).

If the flip-flop's set-up time is not met, output line 38 (line 4, FIG. 4) will then wait (at low) until the next clock edge designated (c), in order to change state of the line 38 from low to high. The transition at time (c) insures that all switching uncertainty and set-up times have been handled. The actual transition at (c) may actually occur at (e) due to the AND gate 36 switching period e' (FIG. 4). In FIG. 4, the set-up time (g) is the value guaranteed for the flip-flop 34, FIG. 1A, to latch the present value on Input B(17). If the set-up time is not met, the flip-flop 34 will not necessarily latch the Input B signal (17) at clock time (2b). However, it will latch at clock edge (2c) of FIG. 4. The flip-flop 34 is metastability-protected (oscillation-proof) by the vendor's design.

These conditions result in a deterministic predictable situation. Since the half-synchronizer flip-flop 34 is synchronized with all the receiving devices, the new output signal 38 will always meet the setup times of the receiving logic circuits 21, 22, ... N and thus any unstable condition will be avoided.

Referring to FIG. 4, it may be noted that the output signal "Y" on line 38 is delayed on the back-end by a time period designated (e). This time is made up of the flip-flop (34) clock-to-output time plus the gate (36) propagation time.

The present half-synchronizer circuitry interface system solves a critical problem that occurs in the interconnection of pre-existing circuitry to newly developed circuitry where asynchronous signals may not be compatible. Normally, a full synchronization operation which operates at both ends of the incoming signals to the receivers would introduce a delay of up to a full clock time at each end of the input signal. However, this would introduce performance degradation. This can now be overcome by use of the half-synchronizer circuitry system which synchronizes only one end (back-end) of the input signal while allowing the front-end to pass through directly as generated by its source (incoming signal on line 17). Thus there is provided a safe, reliable and deterministic design which will not degrade system performance.

While the described system has been presented in a preferred embodiment, other arrangements may still use the technique involved and be encompassed by the following claims.

What is claimed is:

1. In a system where a first digital module, operating on an asynchronous time rate in relation to a second digital module, is connected to said second digital module operating on a synchronous clock, a control system for enabling compatible digital data transfer from said first module to said second module comprising:

(a) synchronous clock generation means in said second module;

(b) means in said second module for receiving an input asynchronous digital control signal from said first module, said means including:

(b1) first means to time the said input asynchronous digital control signal so that its first transition from inactive-to-active occurs before the rising edge of a clock generated by said synchronous clock generation means;

(b2) second means to time the first input control signal transition from active-to-inactive after a subsequent rising edge of said synchronous clock said subsequent rising edge occurring one or more clock periods after said first transition from inactive-to-inactive of said input asynchronous digital control signal;

(b3) output signals derived from said input signals which are compatible with the synchronous clock signals in said second module.

2. The system of claim 1 wherein said first means includes:

(b1a) means to initiate the output signal inactive-to-active transition without delay on the next rising clock after the switching-uncertainty period of said inactive-to-active transition of said input control signal has been expended.

3. The system of claim 1 wherein said second means includes:

(b2a) means to delay the output signal active-to-inactive transition until the next rising clock after the switching-uncertainty period of the active-to-inactive transition of said input control signal has been expended.

4. The system of claim 1 wherein said first means directly activates said output signal after a safety period greater than the specified uncertainty period of the inactive-to-active transition of said input control signal.

5. The system of claim 1 wherein said second means delays said active-to-inactive transition of said input control signal until the first rising clock beyond the time needed to expend the switching uncertainty period for the input control signal's active-to-inactive transition.

6. A method of controlling the timing of data transfers between non-synchronous modules comprising the steps of:

(a) receiving an asynchronous input control signal from a first digital module to an interface in a second module having a synchronous clock signal;

(b) arranging that the first "active" transition of said input control signal occurs before a rising transition of the synchronous clock in said interface of said second module;

(c) enabling one or more synchronous clock periods to occur before the first inactive transition of said input control signal occurs;

(d) delaying the first "inactive" transition, of said input control signal, beyond its switching uncertainty period, until the next occurring rising synchronous clock transition, to develop a synchronized output transition control signal from said input signal's inactive transition moment.

7. A half synchronizer control system for synchronizing an input signal to a receiving module which input signal was generated from an asynchronous sending module, said control system comprising:

(a) an asynchronous sending module for generating an asynchronous input signal to a receiving module;

(b) a receiving module having a synchronous generating means for generating synchronous clock signals and providing a synchronized output signal for fan-out to a plurality of digital modules operating in synchronism with said receiving module, said receiving module including:

(b1) control means for receiving said asynchronous input signal and for generating said synchronized output signal in synchronism with said synchronous clock signals, said control means including:

(b1a) AND gate means for receiving said asynchronous input signal and the Q output signal of a flip-flop means, including:

(b1a1) said synchronized output signal operating to set its inactive-to-active transition before the rising edge of said synchronous clock signal and to set its subsequent active-to-inactive transition to coincide with the next rising edge of said synchronous clock signal which occurs after the uncertainty transition period in said input signals subsequent active-to-inactive transition;

(b1b) said flip-flop means for receiving said asynchronous input signal and being clocked by said synchronous clock signals and including:

(b1b1) said Q output signal for input to said AND gate means.

* * * * *